United States Patent [19]

Cartagena et al.

[11] Patent Number: 5,714,793
[45] Date of Patent: Feb. 3, 1998

[54] COMPLEMENTARY VERTICAL BIPOLAR JUNCTION TRANSISTORS FORMED IN SILICON-ON-SAPHIRE

[75] Inventors: Eric N. Cartagena, Chula Vista; Howard W. Walker, San Diego, both of Calif.

[73] Assignee: The United States of America as represented by the Secretary of the Navy, Washiington, D.C.

[21] Appl. No.: 700,894

[22] Filed: Aug. 21, 1996

Related U.S. Application Data

[62] Division of Ser. No. 415,389, Apr. 3, 1995, Pat. No. 5,641,691.

[51] Int. Cl.[6] .................................................. H01L 21/8228
[52] U.S. Cl. .......................... 257/507; 257/525; 257/511; 257/586; 257/526; 257/623
[58] Field of Search .................................. 257/507, 565, 257/511, 586, 623, 517, 526

[56] References Cited

U.S. PATENT DOCUMENTS

| | | | |
|---|---|---|---|
| H1637 | 3/1997 | Offord et al. | 437/173 |
| 3,941,647 | 3/1976 | Druminski | 156/612 |
| 4,261,003 | 4/1981 | Magdo et al. | 257/526 |
| 5,362,659 | 11/1994 | Cartagena | 437/31 |
| 5,374,567 | 12/1994 | Cartagena | 437/31 |
| 5,434,446 | 7/1995 | Hilton et al. | 257/526 |
| 5,552,626 | 9/1996 | Morikawa | 257/526 |

FOREIGN PATENT DOCUMENTS

| 0220769 | 9/1991 | Japan | 257/507 |
|---|---|---|---|

*Primary Examiner*—Wael Fahmy
*Assistant Examiner*—David B. Hardy
*Attorney, Agent, or Firm*—Harvey Fendelman; Peter A. Lipovsky; Michael A. Kagan

[57] ABSTRACT

A method is described for fabricating a complementary, vertical bipolar semiconducting structure. An N+ silicon island and a P+ silicon island separated by a first oxide layer are formed on a sapphire substrate. An NPN junction device is formed on the N+ silicon island by epitaxially growing an N-type silicon layer on the N+ silicon island. Then, a P region is created in the N-type silicon layer. An N+ region created in the P region completes the NPN junction device. Similarly, a PNP junction device is formed by epitaxially growing a P-type silicon layer on the P+ silicon island. Then, an N region is created in the P-type silicon layer. A P+ region created in the N region completes the PNP junction device.

6 Claims, 6 Drawing Sheets

COMPLEMENTARY VERTICAL BIPOLAR JUNCTION TRANSISTORS FORMED IN SILICON-ON-SAPHIRE

This is a divisional of application Ser. No. 08/415,389 filed Apr. 3, 1995, is now U.S. Pat. No. 5,641,691.

This present invention relates to a method for manufacturing semiconducting wafers, and more particularly, to fabricating complementary vertical bipolar junction transistors in silicon-on-sapphire.

BACKGROUND OF THE INVENTION

Traditional bipolar circuitry design relies on high performance vertical transistors for many dynamic functions. Complementary bipolar circuits offer the benefits of reduced power dissipation, increased switching speed, and more flexible circuit design in comparison to designs with resistive or active loads. Benefits obtainable by fabricating complementary bipolar circuits in silicon-on-sapphire (SOS) include: latch up immunity, high packing density, radiation immunity and faster circuits. Previous work in the area of bipolar junction transistors in SOS includes the fabrication of epitaxial vertical bipolar junction transistors in SOS, lateral bipolar junction transistors in SOS, ion implanted vertical bipolar junction transistors in SOS, and bipolar junction transistors integrated with CMOS transistors in SOS. The processing for manufacturing these types of transistors, all of which have a single polarity, is not generally modifiable to manufacturing complementary transistors.

Almost all present complementary bipolar transistor manufacturing techniques use some form of junction isolation method. However, transistors manufactured by the junction isolation method have undesirable performance limitations such as parasitic capacitance and latch-up susceptibility.

A process for manufacturing complementary bipolar devices is described in Feindt, S., et al., "A Complementary Bipolar Process On Bonded Wafers," *Proceedings of the Second International Symposium On Semiconductor Wafer Bonding: Science, Technology, And Applications*, Proceedings Volume 93–29, pages 189–196, The Electrochemical Society, Inc. (1993). The structure manufactured by the process described in this paper uses a buried silicon dioxide, or oxide layer to provide dielectric isolation between PNP and NPN devices. One limitation of such use of a buried oxide layer is the relatively low thermal conductivity of silicon dioxide. The buried oxide layer does not conduct heat away from the PNP and NPN devices very well, thereby limiting the current carrying capacity of such devices.

Sapphire has excellent dielectric properties, as well has high thermal conductivity (42 W/m·K), compared to the thermal conductivity of silicon dioxide (1 W/m·K). A junction device having a sapphire substrate should having a higher current carrying capacity than a junction device fabricated on a silicon dioxide substrate. The excellent electrical insulating properties of sapphire would provide devices having reduced parasitic capacitance, and in which dynamic power consumption is minimized. Therefore, a need exists for a method for manufacturing complementary, vertical bipolar transistors using sapphire to take advantage of its dielectric and thermal characteristics. Structures manufactured with sapphire should exhibit higher current carrying capacity than structures using buried oxide as an insulator. Complementary bipolar transistors embodying sapphire as an insulator would rival CMOS circuitry in processing speed and chip size.

SUMMARY OF THE INVENTION

The present invention provides a method for fabricating complementary, vertical bipolar junction transistors. In accordance with such method, an N+ silicon island and a P+ silicon island separated by a first oxide layer are formed on a sapphire substrate. An NPN junction device is formed on the N+ silicon island by epitaxially growing an N-type silicon layer on the N+ silicon island. Then, a P region is created in the N-type silicon layer. An N+ region created in the P region completes the NPN junction device. Similarly, a PNP junction device is formed by epitaxially growing a P-type silicon layer on the P+ silicon island. Then, an N region is created in the P-type silicon layer. A P+ region created in the N region completes the PNP junction device.

The invention also provides a complementary, vertical bipolar semiconducting structure. A first oxide layer is deposited on a sapphire substrate. An NPN device formed on the first oxide layer comprises: 1) an N+ silicon island having a first crystal structure formed on the first oxide layer; 2) an N layer formed on the N+ silicon island and having the first crystal structure; 3) a P region formed in the N silicon layer; and 4) an N+ region formed in the P region. A PNP device formed on the wafer comprises: 1) a P+ silicon island having a second crystal structure formed on the first oxide layer; 2) a P layer formed on the P+ silicon island and having the second crystal structure; 3) an N region formed in the P layer; and 4) a P+ region formed in the N region. A second oxide layer between the NPN and PNP devices provides a dielectric barrier. The wafer also includes a third oxide layer formed over the NPN and PNP structures. Contacts through the third oxide layer provide electrical contact to the N+ and P regions of the NPN device. Likewise, contacts through the third oxide layer provide electrical contact to the P+ and N regions of the PNP device.

Junction devices manufactured in accordance with the methods of the present invention devices should have reduced parasitic capacitance, reduced static and dynamic power consumption, and higher current carrying capacity than prior art complementary junction devices.

DESCRIPTION OF THE PREFERRED EMBODIMENT

Figure 1:
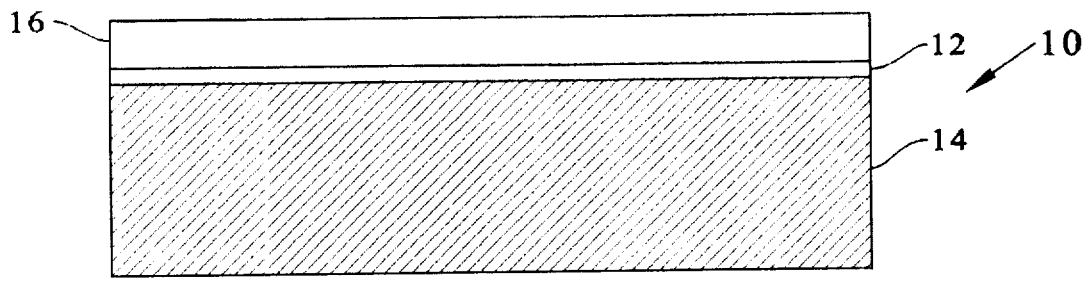
FIG. 1 shows the initial steps in the fabrication of a wafer on which is to be formed complementary vertical bipolar junction transistors in silicon-on-sapphire in accordance with the methods of the present invention.
Figure 2:
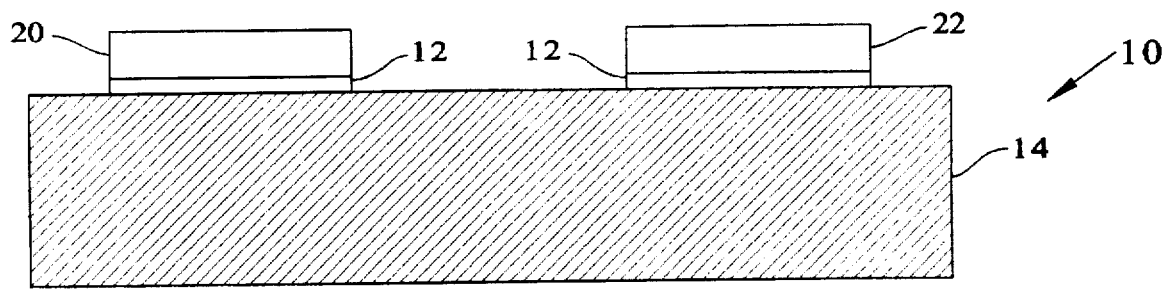
FIG. 2 shows isolated islands of silicon formed on the sapphire substrate.

The present invention provides a method for fabricating complementary vertical bipolar junction transistors in silicon-on-sapphire. Referring to FIG. 1, a wafer 10 is formed by growing a thin silicon layer 12, having for example, a thickness of about 2500 angstroms, on a sapphire substrate 14. The term "wafer" refers to the structure which is subjected to the various manufacturing steps described herein. The silicon layer 12 provides a seed layer for the subsequent epitaxial growth of another silicon layer. The crystal structure of the silicon layer 12 then is improved using standard, double solid-phase epitaxy techniques. A thin oxide layer 16, which may have a thickness of approximately 1000 angstroms, is deposited uniformly over the improved silicon layer 12. Photolithographic techniques are used to pattern the oxide layer 16 so that specific regions of the silicon layer 12 and oxide layer 16 are chemically removed, leaving isolated silicon islands 20 and 22 on the wafer 10, as shown in FIG. 2.

Figure 3:
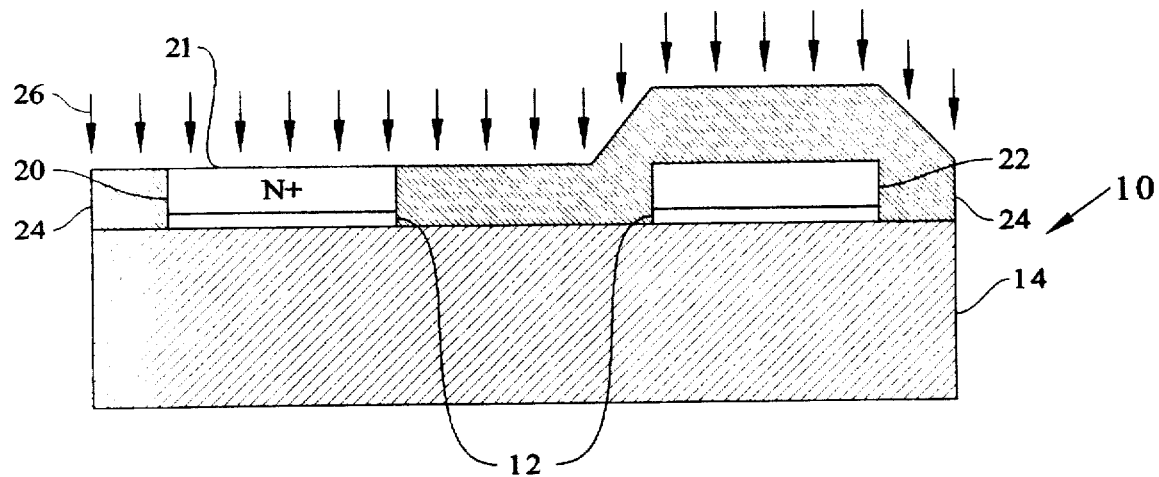
FIG. 3 shows the formation of an implanted N+ buried layer in one of the isolated islands of silicon.
Figure 4:
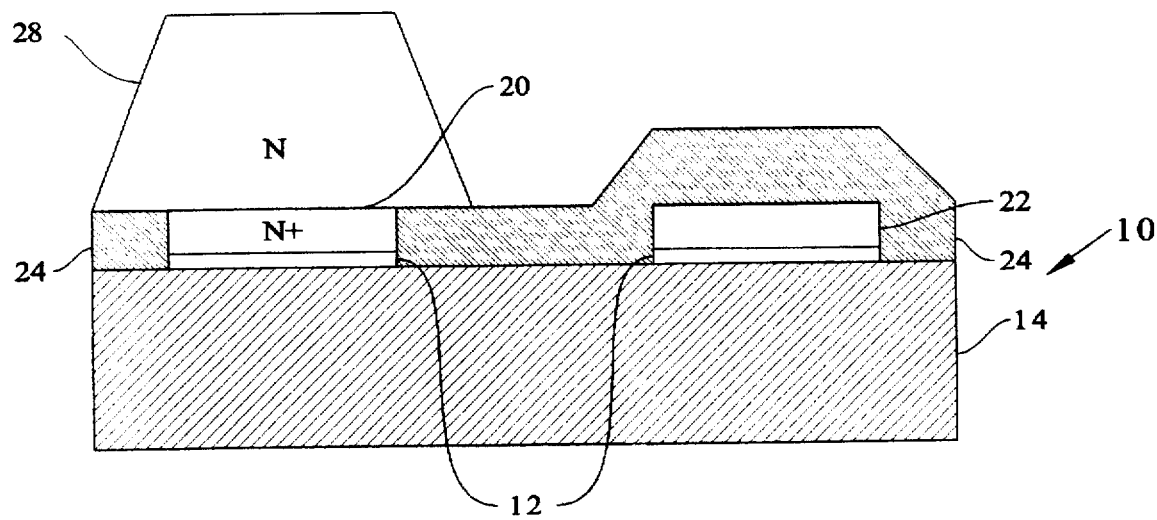
FIG. 4 shows selective epitaxial growth of an N silicon layer.

Referring to FIG. 3, an oxide layer 24 is deposited over the wafer 10, masked, and etched to expose the surface 21 of silicon island 20. An n-type dopant 26, such as arsenic, is ion implanted through the exposed surface 21 into the silicon island 20, as for example, at an implant dosage of about $10^{16}/cm^2$ having an energy of about 100 KeV to transform silicon layer 20 into an N+ silicon layer, having, by way of example, a concentration greater than about $10^{20}/cm^3$, on which will be fabricated an NPN transistor. Next, N-type silicon (approximately $10^{16}/cm^3$) is epitaxially grown over the N+ silicon layer island 20, which somewhat overlaps onto the adjoining oxide layer 24, as shown in FIG. 4, to form an N silicon layer 28.

Figure 5:
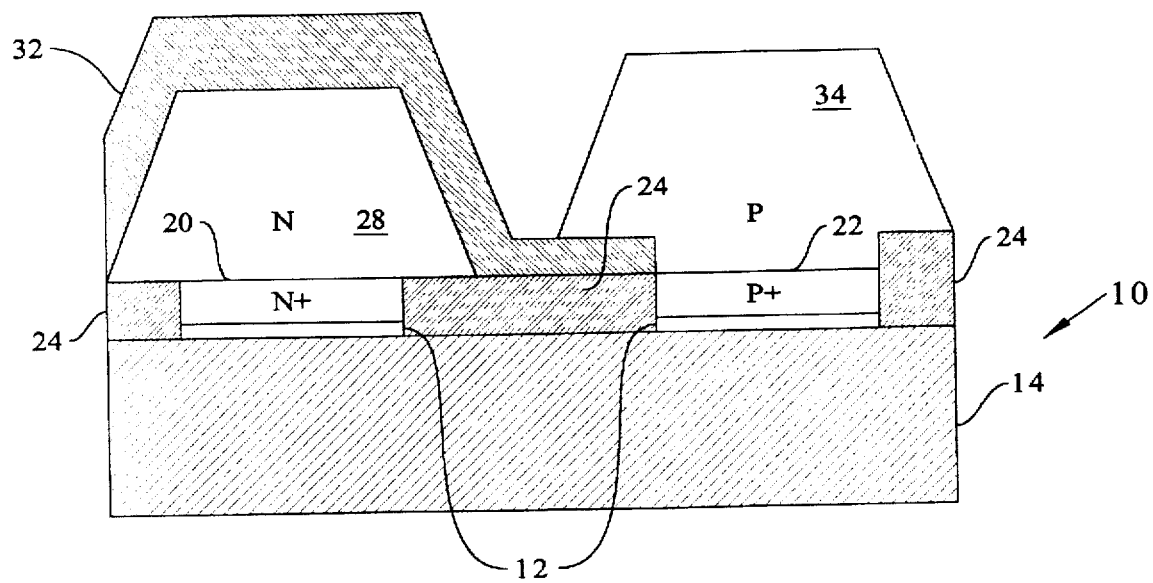
FIG. 5 shows epitaxial growth of a P layer.

Referring to FIG. 5, an oxide layer 32 is deposited over the wafer 10, patterned, and etched to expose the surface of silicon island 22. Then, a p-type dopant such as boron having, for example, an implant dosage of about $10^{16}/cm^3$ and an energy of about 50 KeV is implanted into the silicon island 22 to transform the silicon island 22 into a P+ region having a concentration which is preferably is greater than $10^{19}/cm^3$. Then, a p-type, or P silicon layer 34 is epitaxially grown on the P+ silicon island 22. The P silicon layer 34 preferably has a concentration of about $10^{15}/cm^3$.

Figure 6:
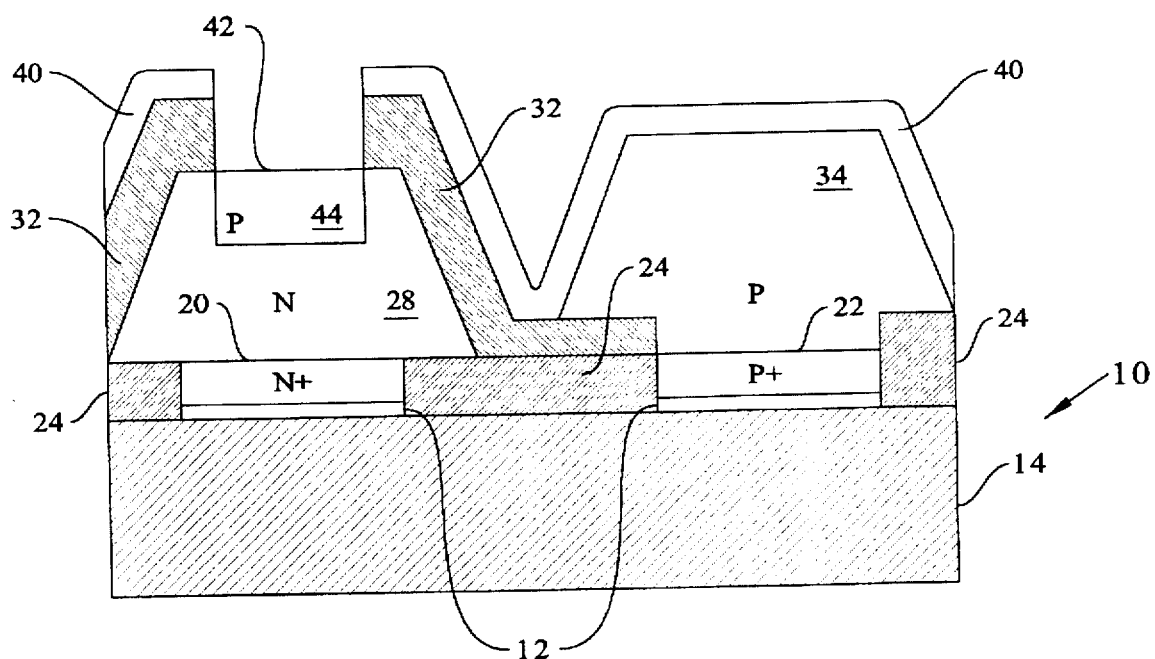
FIG. 6 shows a p-type region formed in the N silicon layer.

Referring to FIG. 6, a photoresist layer 40 is deposited over the wafer 10. The photoresist layer 40 and a region of oxide layer 32 are selectively etched to expose the surface 42 of the N silicon layer 28. A p-type dopant, such as boron, is ion implanted into the N silicon layer 28 at $10^{12}$–$10^{13}/cm^2$ and at an energy of about 50 KeV to create a P region 44 having a concentration in the range of about $10^{18}cm^3$ within the N silicon layer 28. Then, the photoresist layer 40 is removed (not shown), as for example, by etching so as to leave no residue on the wafer 10.

Figure 7:
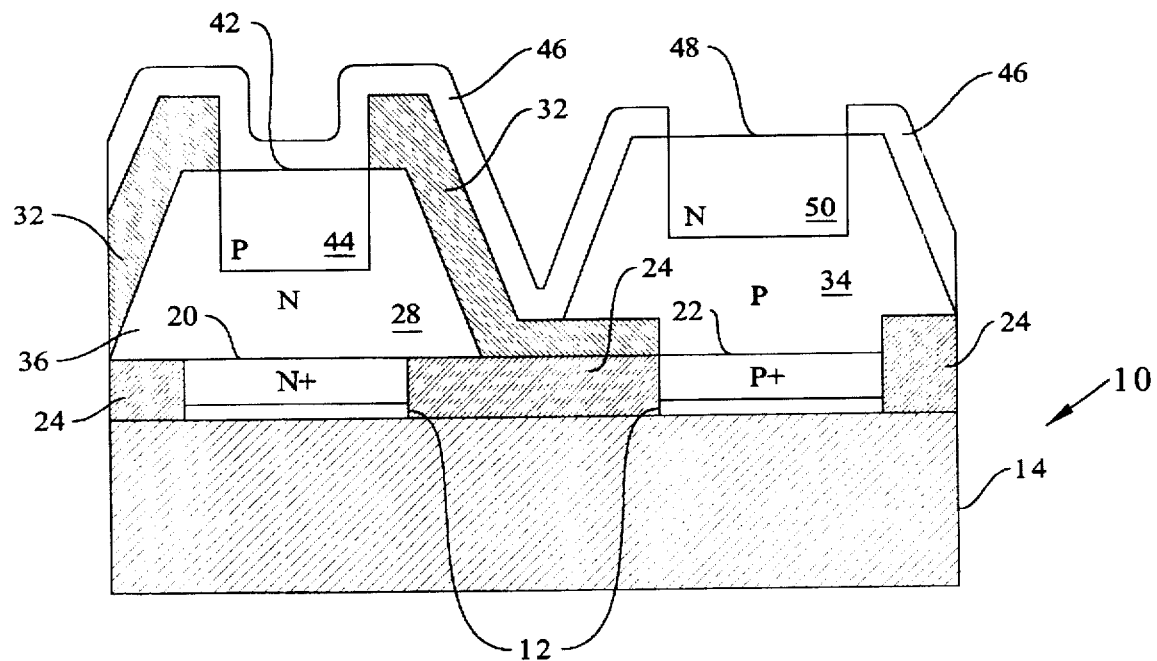
FIG. 7 shows an n-type region formed in the P layer.

As shown in FIG. 7, a photoresist layer 46 formed over the wafer 10 is selectively etched to expose surface 48 of the P silicon layer 34. Then, an n-type dopant, such as arsenic, is ion implanted at an implant dosage of about $10^{13}/cm^2$ and at an energy level of about 100 KeV into the P silicon layer 34 to form an N region 50 having a concentration in the range of about $10^{18}/cm^3$. Next, the photoresist layer 46 is removed. The wafer 10 then is heated at about 900° C. for approximately one hour to activate the n-type dopant in the N region 50.

Figure 8:
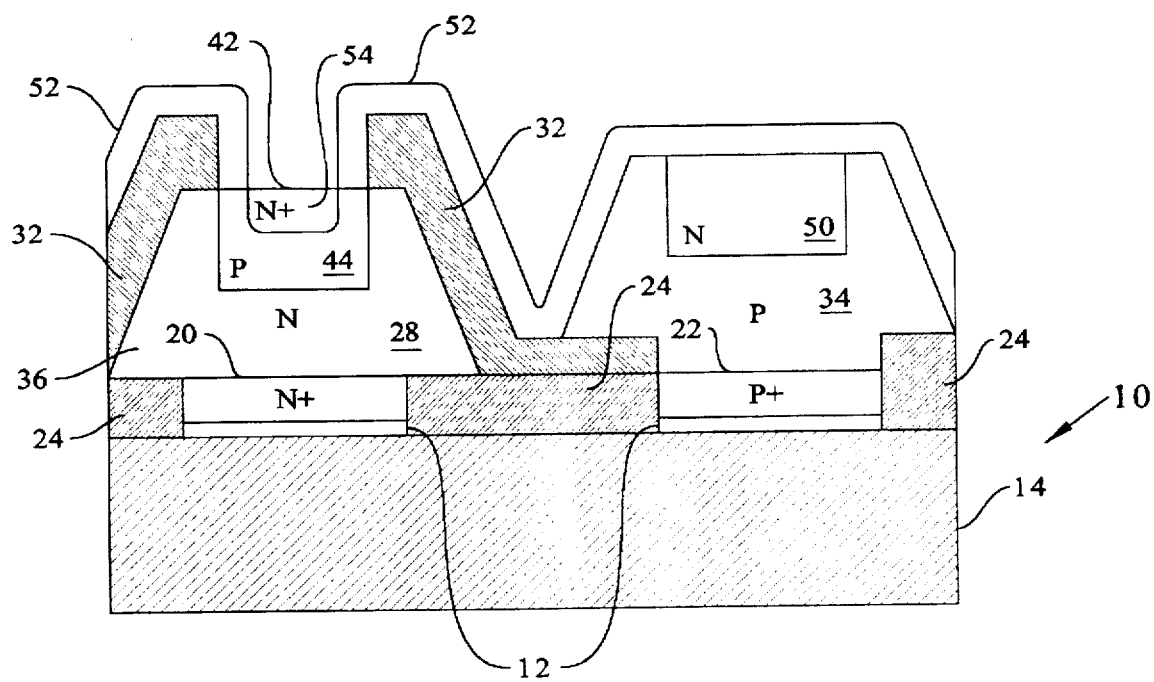
FIG. 8 shows an N+ region formed in the P region of the layer.

FIG. 8 shows a photoresist layer 52 formed over the wafer 10. The photoresist layer 52 is selectively etched to expose the surface 42 of the N silicon layer 28. A suitable n-type species, such as arsenic, is ion implanted at a dosage of about $10^{16}/cm^2$ with an energy in the range of about 120 KeV through the surface 42 to create N+ region 54 having concentration of about $10^{20}/cm^3$ in the P region 44. The photoresist layer 52 then is removed.

Figure 9:
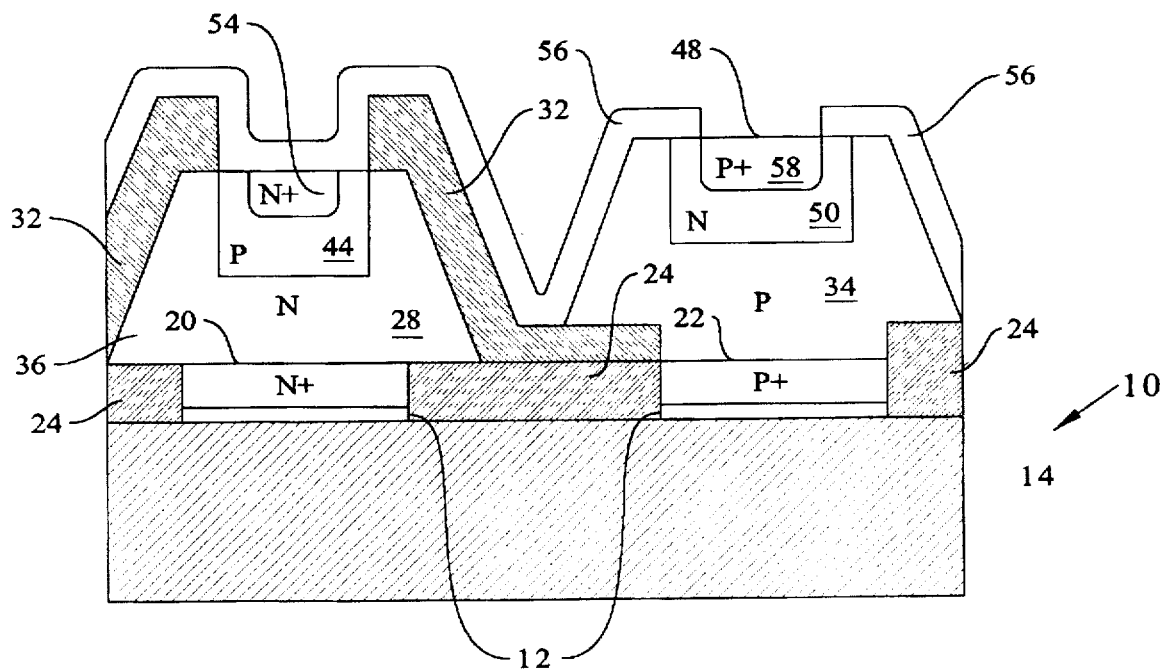
FIG. 9 shows a P+ formed in the n-type region of the P layer.

In FIG. 9, a photoresist layer 56 shown formed over the wafer 10 is selectively etched to expose the surface 48 of P silicon layer 34. A p-type dopant, such as boron, is ion implanted through the surface 48 at a dosage of about $10^{16}/cm^2$ and at an energy of about 90 KeV to create a P+ region 58 having a concentration of about $10^{19}/cm^3$ within the N region 50. The photoresist layer 56 then is etched away.

Figure 10:
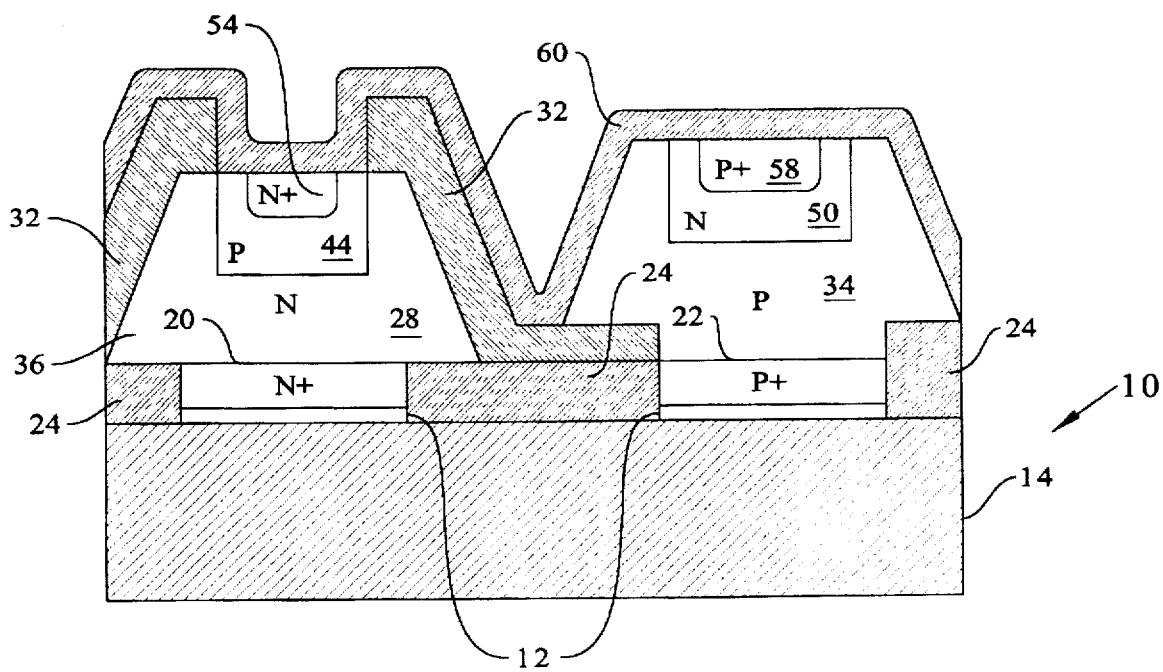
FIG. 10 shows an oxide layer formed over the wafer.
Figure 11:
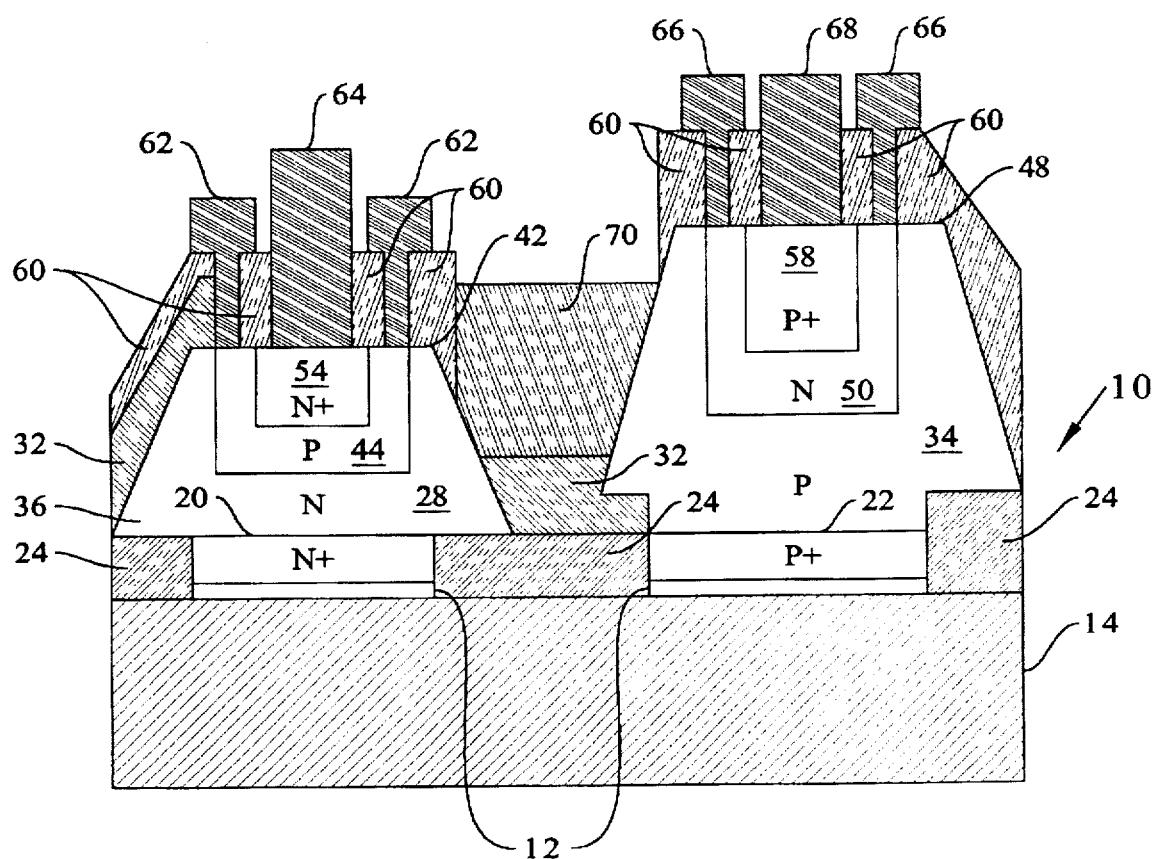
FIG. 11 shows the completed structure pair of complementary vertical bipolar junction transistors.

In FIG. 10, an oxide layer 60 is shown deposited over the wafer 10. Referring to FIG. 11, the oxide layer 60 is patterned and etched to provide access to surfaces 42 and 48. A layer of conductive material (not shown), such as aluminum, is deposited over the wafer, patterned and etched to form: 1) base contacts 62 which contact the P region 44 of N silicon layer 28; 2) an emitter contact 64 which contacts the N+ region 54 of N silicon layer 28; 3) base contacts 66 which contact the N region 50 of P silicon layer 34; and 4) emitter contacts 68 which contacts the P+ region 58 of the P silicon layer 34. The remaining conductive material provides a collector contact 70 in contact with N silicon layer 28 and P silicon layer 34.

Polysilicon may be used as an alternative to aluminum for the base and emitter contact material to minimize parasitic capacitances. GeSi heterojunctions may be formed in the base region to provide high gain, high-speed bipolar transistors.

Obviously, many modifications and variations of the present invention are possible in light of the above teachings. For example, any number and/or combination of the individual transistors described above may be manufactured in accordance with the teachings of the present invention. It is therefore to be understood that within the scope of the appended claims, the invention may be practiced otherwise than as specifically described.

We claim:

1. A complementary vertical bipolar junction transistor structure, comprising:

a sapphire substrate having a generally planar surface;

a first silicon layer formed on said sapphire substrate;

an NPN structure comprising:

an N+ silicon island having a first crystal structure formed on said first silicon layer;

an N silicon layer formed on said N+ silicon island and having said first crystal structure wherein said N silicon layer has non-orthogonally sloped sidewalls with respect to said surface of said sapphire substrate;

a P region formed in said N silicon layer; and an N+ region formed in said P region;

a PNP structure comprising:

a P+ silicon island having a second crystal structure formed on said first silicon layer;

a P silicon layer formed on said P+ silicon island and having said second crystal structure;

an N region formed in said P layer; and a P+ region formed in said N region;

a first oxide layer formed between said NPN and PNP structures;

a second oxide layer formed over said NPN and PNP structures;

a first base electrical contact which contacts said P region through said second oxide layer;

a first emitter electrical contact which contacts said N+ region through said second oxide layer;

a second base electrical contact which contacts said N region through said second oxide layer; and a second emitter electrical contact which contacts said P+ region through said second oxide layer.

2. A complementary vertical bipolar junction transistor structure, comprising:
- a sapphire substrate having a generally planar surface;
- a first silicon layer formed on said sapphire substrate;
- an NPN structure comprising:
  - an N+ silicon island having a first crystal structure formed on said first silicon layer;
  - an N silicon layer formed on said N+ silicon island and having said first crystal structure;
  - a P region formed in said N silicon layer; and
  - an N+ region formed in said P region;
- a PNP structure comprising:
  - a P+ silicon island having a second crystal structure formed on said first silicon layer;
  - a P silicon layer formed on said P+ silicon island and having said second crystal structure wherein said P silicon layer has non-orthogonally sloped sidewalls with respect to said surface of said sapphire substrate;
  - an N region formed in said P layer; and
  - a P+ region formed in said N region;
- a first oxide layer formed between said NPN and PNP structures;
- a second oxide layer formed over said NPN and PNP structures;
- a first base electrical contact which contacts said P region through said second oxide layer;
- a first emitter electrical contact which contacts said N+ region through said second oxide layer;
- a second base electrical contact which contacts said N region through said second oxide layer; and
- a second emitter electrical contact which contacts said P+ region through said second oxide layer.

3. A complementary vertical bipolar junction transistor structure, comprising:
- a sapphire substrate having a generally planar surface;
- a first silicon layer formed on said sapphire substrate;
- an NPN structure comprising:
  - an N+ silicon island having a first crystal structure formed on said first silicon layer;
  - an N silicon layer formed on said N+ silicon island and having said first crystal structure wherein said N silicon layer has non-orthogonally sloped sidewalls with respect to said surface of said sapphire substrate;
  - a P region formed in said N silicon layer; and
  - an N+ region formed in said P region;
- a PNP structure comprising:
  - a P+ silicon island having a second crystal structure formed on said first silicon layer;
  - a P silicon layer formed on said P+ silicon island and having said second crystal structure wherein said P silicon layer has non-orthogonally sloped sidewalls with respect to said surface of said sapphire substrate;
  - an N region formed in said P layer; and
  - a P+ region formed in said N region;
- a first oxide layer formed between said NPN and PNP structures;
- a second oxide layer formed over said NPN and PNP structures;
- a first base electrical contact which contacts said P region through said second oxide layer;
- a first emitter electrical contact which contacts said N+ region through said second oxide layer;
- a second base electrical contact which contacts said N region through said second oxide layer; and
- a second emitter electrical contact which contacts said P+ region through said second oxide layer.

4. A complementary bipolar junction transistor, comprising:
- a sapphire substrate having a generally planar surface;
- an N+ silicon island formed over said sapphire substrate;
- a P+ silicon island formed over said sapphire substrate;
- a first silicon layer formed over said sapphire substrate and interposed between said sapphire substrate and each of said N+ and P+ silicon islands;
- an NPN junction device which includes:
  - an epitaxial N-type silicon layer grown on said N+ silicon island and having non-orthogonally sloped sidewalls with respect to said surface of said sapphire substrate;
  - a P region implanted in said N-type silicon layer;
  - an N+ region implanted in said P region; and
- a PNP junction which includes:
  - an epitaxial P-type silicon layer grown on said P+ silicon island;
  - an N region implanted in said P-type silicon layer; and
  - a P+ region implanted in said N region.

5. A complementary bipolar junction transistor, comprising:
- a sapphire substrate having a generally planar surface;
- an N+ silicon island formed over said sapphire substrate;
- a P+ silicon island formed over said sapphire substrate;
- a first silicon layer formed over said sapphire substrate and interposed between said sapphire substrate and each of said N+ and P+ silicon islands;
- an NPN junction device which includes:
  - an epitaxial N-type silicon layer grown on said N+ silicon island;
  - a P region implanted in said N-type silicon layer;
  - an N+ region implanted in said P region; and
- a PNP junction device which includes:
  - an epitaxial P-type silicon layer grown on said P+ silicon island and having non-orthogonally sloped sidewalls with respect to said surface of said sapphire substrate;
  - an N region implanted in said P-type silicon layer; and
  - a P+ region implanted in said N region.

6. A complementary bipolar junction transistor, comprising:
- a sapphire substrate having a generally planar surface;
- an N+ silicon island formed over said sapphire substrate;
- a P+ silicon island formed over said sapphire substrate;
- a first silicon layer formed over said sapphire substrate and interposed between said sapphire substrate and each of said N+ and P+ silicon islands;
- an NPN junction device which includes:
  - an epitaxial N-type silicon layer grown on said N+ silicon island wherein said N-type silicon layer has non-orthogonally sloped sidewalls with respect to said surface of said sapphire substrate;
  - a P region implanted in said N-type silicon layer;
  - an N+ region implanted in said P region; and
- a PNP junction device which includes:
  - an epitaxial P-type silicon layer grown on said P+ silicon island and having non-orthogonally sloped sidewalls with respect to said surface of said sapphire substrate;
an N region implanted in said P-type silicon layer; and
a P+ region implanted in said N region.

* * * * *